US011527429B2

(12) United States Patent
Parkhe

(10) Patent No.: US 11,527,429 B2
(45) Date of Patent: Dec. 13, 2022

(54) SUBSTRATE SUPPORT ASSEMBLY FOR HIGH TEMPERATURE PROCESSES

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 219 days.

(21) Appl. No.: 16/284,728

(22) Filed: Feb. 25, 2019

(65) Prior Publication Data

US 2019/0189492 A1   Jun. 20, 2019

Related U.S. Application Data

(63) Continuation of application No. 15/061,734, filed on Mar. 4, 2016, now Pat. No. 10,249,526.

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67103* (2013.01); *H01L 21/67109* (2013.01); *H01L 21/67248* (2013.01); *H01L 21/6831* (2013.01); *H01L 21/6875* (2013.01); *H01L 21/68785* (2013.01)

(58) Field of Classification Search
CPC ........... H01L 21/6833; H01L 21/67103; H01L 21/67109; H01L 21/67248; H01L 21/6831; H01L 21/6875; H01L 21/68785

USPC ......................................................... 361/234
See application file for complete search history.

(56) References Cited

U.S. PATENT DOCUMENTS

| 4,273,148 | A |   | 6/1981  | Charland |
|-----------|---|---|---------|----------|
| 4,305,567 | A |   | 12/1981 | Lunt |
| 5,421,594 | A |   | 6/1995  | Becerra |
| 5,511,799 | A |   | 4/1996  | Davenport et al. |
| 5,535,090 | A |   | 7/1996  | Sherman |
| 5,595,241 | A | * | 1/1997  | Jelinek .............. H01L 21/67109 |
|           |   |   |         | 118/725 |
| 5,851,298 | A |   | 12/1998 | Ishii |
| 6,219,219 | B1|   | 4/2001  | Hausmann et al. |
| 6,310,755 | B1|   | 10/2001 | Kholodenko et al. |
| 6,503,368 | B1|   | 1/2003  | Kholodenko et al. |
| 7,175,737 | B2| * | 2/2007  | Sago ...................... B23Q 3/154 |
|           |   |   |         | 118/724 |

(Continued)

FOREIGN PATENT DOCUMENTS

| JP | 2009164483 A | 7/2009 |
| JP | 2013251354 A | 12/2013 |

OTHER PUBLICATIONS

International Search Report and Written Opinion of the international Searching Authority for PCT Application No. PCT/US2015/054982 dated Feb. 15, 2016, 15 pages.

(Continued)

*Primary Examiner* — Kevin J Comber
(74) *Attorney, Agent, or Firm* — Lowenstein Sandler LLP

(57) ABSTRACT

An electrostatic chuck includes a ceramic body and adapter objects. The adapter objects collectively form a plurality of openings distributed over a bottom surface of the ceramic body at different distances from a center of a circle defined by the bottom surface of the ceramic body.

20 Claims, 8 Drawing Sheets

(56) References Cited

U.S. PATENT DOCUMENTS

| | | |
|---|---|---|
| 7,697,260 B2 | 4/2010 | Brown et al. |
| 8,194,384 B2 | 6/2012 | Nasman et al. |
| 8,390,980 B2 | 3/2013 | Sansoni et al. |
| 8,559,159 B2 | 10/2013 | Roy et al. |
| 10,008,399 B2 | 6/2018 | Parkhe |
| 10,008,404 B2 | 6/2018 | Parkhe |
| 2002/0050246 A1 | 5/2002 | Parkhe |
| 2002/0075624 A1* | 6/2002 | Wang .............. C04B 37/006 361/234 |
| 2003/0104186 A1 | 6/2003 | Ito |
| 2003/0107866 A1* | 6/2003 | Lee ................. H01L 21/6831 361/234 |
| 2004/0065259 A1 | 4/2004 | Inazumachi et al. |
| 2004/0226515 A1 | 11/2004 | Yendler et al. |
| 2005/0219786 A1 | 10/2005 | Brown et al. |
| 2005/0241765 A1 | 11/2005 | Dhindsa et al. |
| 2006/0096946 A1 | 5/2006 | Schaepkens et al. |
| 2006/0098379 A1 | 5/2006 | Otaka et al. |
| 2006/0279899 A1* | 12/2006 | Aihara ............ H01L 21/6831 361/234 |
| 2008/0029032 A1 | 2/2008 | Sun et al. |
| 2008/0089001 A1 | 4/2008 | Parkhe |
| 2008/0138645 A1 | 6/2008 | Kawajiri et al. |
| 2009/0014323 A1 | 1/2009 | Yendler |
| 2009/0201622 A1* | 8/2009 | Brown ............. H01L 21/6831 361/234 |
| 2010/0003824 A1 | 1/2010 | Kadkhodayan et al. |
| 2010/0020463 A1 | 1/2010 | Nasman et al. |
| 2010/0039747 A1 | 2/2010 | Sansoni et al. |
| 2011/0005686 A1 | 1/2011 | Tanaka et al. |
| 2011/0292562 A1 | 12/2011 | Lee et al. |
| 2012/0055403 A1* | 3/2012 | Gomi ............... C23C 16/4404 118/725 |
| 2012/0076574 A1 | 3/2012 | Parkhe |
| 2012/0100379 A1 | 4/2012 | Luo et al. |
| 2013/0088808 A1 | 4/2013 | Parkhe et al. |
| 2013/0276980 A1 | 10/2013 | Lubomirsky et al. |
| 2013/0286533 A1 | 10/2013 | Takasaki et al. |
| 2014/0159325 A1 | 6/2014 | Parkhe et al. |
| 2014/0209245 A1 | 7/2014 | Yamamoto et al. |
| 2014/0334060 A1 | 11/2014 | Parkhe et al. |
| 2015/0036261 A1 | 2/2015 | Jindo et al. |
| 2015/0077895 A1 | 3/2015 | Jindo et al. |
| 2016/0111315 A1 | 4/2016 | Parkhe |
| 2016/0276198 A1 | 9/2016 | Anada et al. |
| 2016/0343600 A1 | 11/2016 | Parkhe |
| 2017/0178944 A1* | 6/2017 | Yamaguchi ............ H02N 13/00 |
| 2018/0190528 A1 | 7/2018 | Parkhe |
| 2018/0197758 A1 | 7/2018 | Parkhe |
| 2019/0341289 A1 | 11/2019 | Parkhe |

OTHER PUBLICATIONS

International Search Report and Written Opinion of the International Searching Authority for PCT Application No. PCT/US2016/013698 dated Apr. 25, 2016.

International Search Report and Written Opinion of the international Searching Authority for PCT Application No. PCT/US2017/014531 dated May 2, 2017, 14 pages.

Pollock, M., ed., "GRAFOIL® Flexible Graphite, Engineering Design Manual," 2nd edition, Copyright 2002, 117 pages, Graphtech Inc.

"CIRLEX™ Thick Polyimide, H Types", MSDS No. CIR00001, Revised Oct. 8, 1996, printed Jan. 5, 1999, 6 pages.

* cited by examiner

SUBSTRATE SUPPORT ASSEMBLY FOR HIGH TEMPERATURE PROCESSES

RELATED APPLICATION

This application is a continuation application of U.S. patent application Ser. No. 15/061,734, filed on Mar. 4, 2016, which is incorporated by reference herein.

TECHNICAL FIELD

Some embodiments of the present invention relate, in general, to a substrate support assembly that is usable for high temperature processes.

BACKGROUND

Electrostatic chucks are widely used to hold substrates, such as semiconductor wafers, during substrate processing in processing chambers used for various applications, such as physical vapor deposition, etching, or chemical vapor deposition. Electrostatic chucks typically include one or more electrodes embedded within a unitary chuck body which includes a dielectric or semi-conductive ceramic material across which an electrostatic clamping field can be generated.

Electrostatic chucks offer several advantages over mechanical clamping devices and vacuum chucks. For example, electrostatic chucks reduce stress-induced cracks caused by mechanical clamping, allow larger areas of the substrate to be exposed for processing (little or no edge exclusion), and can be used in low pressure or high vacuum environments. Additionally, the electrostatic chuck can hold the substrate more uniformly to a chucking surface to allow a greater degree of control over substrate temperature.

Various processes used in the fabrication of integrated circuits may call for high temperatures and/or wide temperature ranges for substrate processing. For example, electrostatic chucks in etch processes typically operate in a temperature range of up to about 120° C. At temperatures above about 120° C., the components of many electrostatic chucks will begin to fail due to various issues such as de-chucking in $Al_2O_3$ electrostatic chucks, plasma erosion from corrosive chemistry, bond reliability, and so on.

SUMMARY

Some embodiments of the present invention described herein cover an electrostatic chuck comprising a ceramic body having a top and a bottom, one or more heating elements disposed in the ceramic body, and one or more electrodes disposed in the ceramic body. The electrostatic chuck further comprises a plurality of objects bonded to the bottom of the ceramic body by a metal bond, wherein collectively the plurality of objects comprise a plurality of features distributed over the bottom of the ceramic body at a plurality of different distances from a center of a circle defined by the bottom of the ceramic body, and wherein a feature of the plurality of features accommodates a fastener.

Some embodiments of the present invention described herein cover a substrate support assembly that includes an electrostatic chuck comprising one or more objects bonded to a bottom of the electrostatic chuck by a metal bond, wherein collectively the one or more objects comprise a plurality of features distributed over the bottom of the electrostatic chuck at a plurality of different distances from a center of a circle defined by the bottom of the electrostatic chuck, and wherein collectively the plurality of features accommodate a plurality of fasteners. The substrate support assembly further includes a base plate coupled to the electrostatic chuck by the plurality of fasteners, wherein the plurality of fasteners each apply an approximately equal fastening force to couple the base plate to the electrostatic chuck. The substrate support assembly further includes an o-ring disposed between the electrostatic chuck and the base plate at a periphery of the electrostatic chuck.

Some embodiments of the present invention described herein cover a base plate for a substrate support assembly that includes a metal body comprising a recess, the metal body comprising one or more features that accommodate a fastener. The base plate further includes a metal cooling plate disposed in the recess, the metal cooling plate comprising a plurality of channels to receive a coolant, the metal cooling plate further comprising one or more surface features on a top of the metal cooling plate. The base plate further includes a plurality of springs that connect a bottom of the metal cooling plate to the metal body and a thermal gasket on the top of the cooling plate, the thermal gasket comprising one or more layers of polyimide and a plurality of layers of Grafoil® (e.g., graphite).

BRIEF DESCRIPTION OF THE DRAWINGS

Embodiments of the present invention are illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide an electrostatic chuck that includes multiple adapter objects bonded to a bottom of the electrostatic chuck by a metal bond. The adapter objects in one embodiment are discs and/or rings that each include multiple features for receiving a fastener. In another embodiment, the adapter objects are discs or objects having other shape that each include one or a few features for receiving a fastener. The adapter objects may be bonded to a flat bottom of the electrostatic chuck or may be inserted into and bonded to recesses formed on the bottom of the electrostatic chuck.

Embodiments further provide a substrate support assembly that includes the electrostatic chuck having the multiple adapter objects bonded to the bottom of the electrostatic chuck. The substrate support assembly may additionally include a base plate having a spring loaded cooling plate that presses against the electrostatic chuck. The cooling plate may include a gasket with low thermal conductivity that acts as a thermal choke between the cooling plate and the electrostatic chuck. Use of the spring loaded cooling plate including the gasket may enable the electrostatic chuck to maintain a temperature that is up to 200 or 300 degrees Celsius hotter than a temperature of the cooling plate.

The electrostatic chuck may be coupled to the base plate by a collection of fasteners, where each of the fasteners is inserted into one of the adapter objects bonded to the bottom of the electrostatic chuck. The multiple fasteners are located at different distances from a center of a circle defined by the bottom of the electrostatic chuck. In one embodiment, a first set of fasteners are disposed at a first radius from the center of the electrostatic chuck and a second set of fasteners are disposed at a second radius from the center of the electrostatic chuck. The multiple fasteners may be approximately uniformly distributed across the bottom of the electrostatic chuck to evenly distribute a fastening force to couple the electrostatic chuck to the base plate. The fasteners may all be tightened an equal amount to ensure that the fastening forces applied by each fastener is about the same. This facilitates uniform heat transfer properties between the electrostatic chuck and the cooling plate over the electrostatic chuck.

In some embodiments, a high temperature o-ring or gasket is compressed between the base plate and the electrostatic chuck. The high-temperature o-ring or gasket may protect the adapter objects from exposure to processing gasses. Additionally, the electrostatic chuck may include a gas delivery hole that aligns with a gas delivery hole in the base plate. An o-ring may be disposed around the gas delivery holes and compressed between the electrostatic chuck and the base plate.

Figure 1:
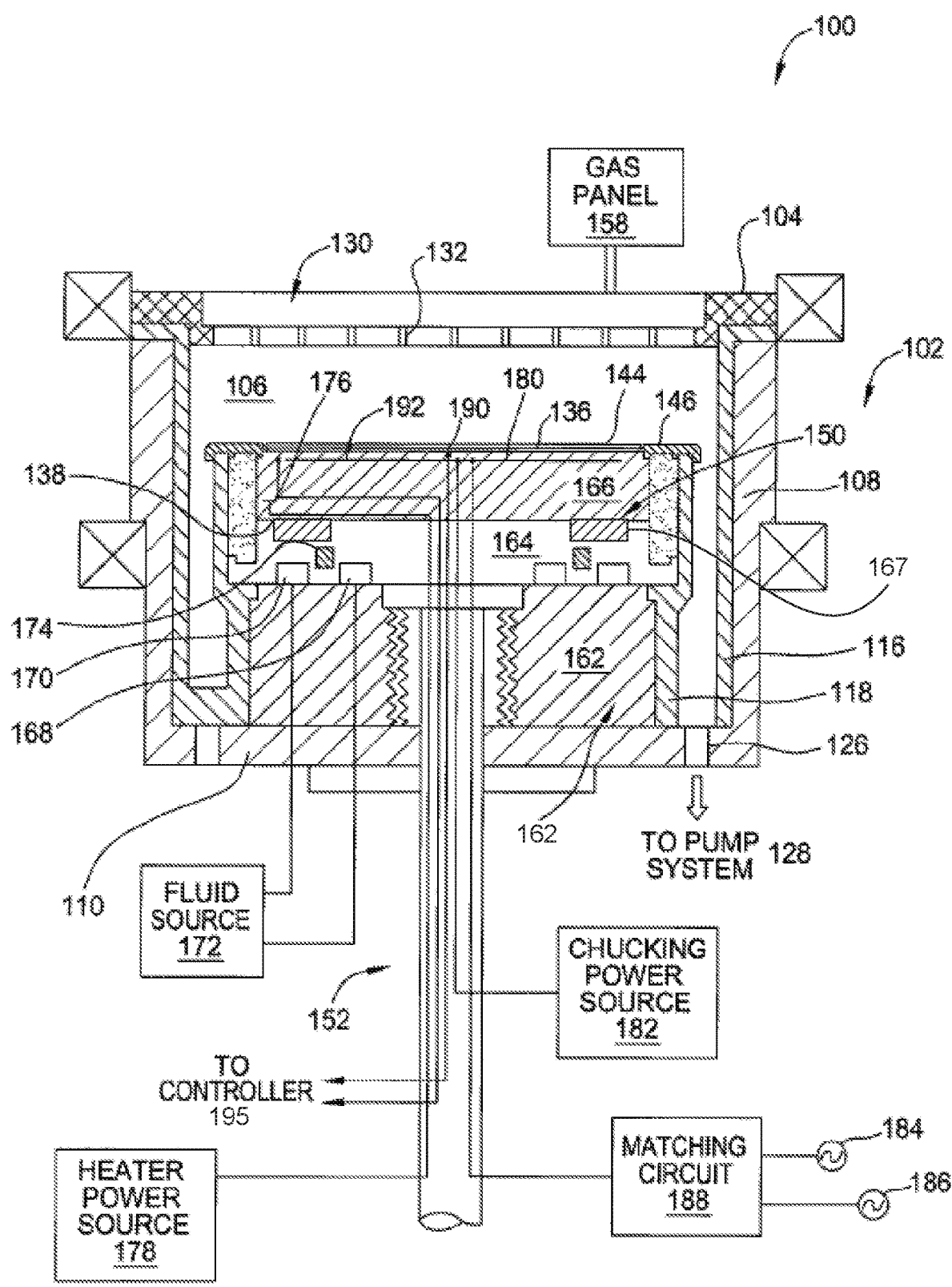
FIG. 1 depicts a sectional side view of one embodiment of a processing chamber.

FIG. 1 is a sectional view of one embodiment of a semiconductor processing chamber 100 having a substrate support assembly 150 disposed therein. The substrate support assembly 150 includes an electrostatic chuck 166 that includes multiple adapter objects 167 bonded to a bottom of the electrostatic chuck 166, as will be discussed in greater detail below. The electrostatic chuck 166 is coupled to a cooling plate by multiple fasteners, as discussed in greater detail below.

The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, $HBr$, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

The substrate support assembly 150 is disposed in the interior volume 106 of the processing chamber 100 below the gas distribution assembly 130. The substrate support assembly 150 holds a substrate 144 during processing. An inner liner 118 may be coated on the periphery of the substrate support assembly 150. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 150 includes a mounting plate 162 supporting a pedestal 152, a base plate 164 and electrostatic chuck 166. In one embodiment, the base plate 164 is coupled to the electrostatic chuck 166 by multiple fasteners. In one embodiment, the base plate 164 includes a thermally conductive base referred to herein as a cooling plate. The substrate support assembly 150 described in embodiments may be used for Johnsen-Rahbek and/or Coulombic electrostatic chucking.

In one embodiment, a protective ring 146 is disposed over a portion of the electrostatic chuck 166 at an outer perimeter of the electrostatic chuck 166. In one embodiment, the electrostatic chuck 166 is coated with a protective layer 136. Alternatively, the electrostatic chuck 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), YAlO3 (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2-xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

The electrostatic chuck 166 may be or include a puck made of a dielectric or electrically insulative material (e.g., having an electrical resistivity of greater than $10^{14}$ Ohm·meter) that is usable for semiconductor processes at temperatures of 180° C. and above. In one embodiment, the electrostatic chuck 166 is composed of materials usable from about 20° C. to about 500° C. In one embodiment, the electrostatic chuck 166 is AlN. The AlN electrostatic chuck 166 may be undoped or may be doped. For example, the AlN may be doped with Samarium oxide ($Sm_2O_3$), Cerium oxide ($CeO_2$), Titanium dioxide ($TiO_2$), or a transition metal oxide. In one embodiment, the electrostatic chuck 166 is $Al_2O_3$. The $Al_2O_3$ electrostatic chuck 166 may be undoped or may be doped. For example, the $Al_2O_3$ may be doped with Titanium dioxide ($TiO_2$) or a transition metal oxide.

One or more adapter objects 167 may be bonded to a bottom of the electrostatic chuck 166. The adapter objects 167 may have a coefficient of thermal expansion that is approximately matched to a coefficient of thermal expansion of the electrostatic chuck 166. In one embodiment, the adapter objects 167 are made of a SiC porous body that is infiltrated with an AlSi alloy (referred to as AlSiSiC). In one embodiment, the adapter objects 167 are molybdenum. Other materials may also be used.

The mounting plate 162 may be coupled to the bottom 110 of the chamber body 102 and includes passages for routing utilities (e.g., fluids, power lines, sensor leads, etc.) to the base plate 164 and the electrostatic chuck 166. The base plate 164 and/or electrostatic chuck 166 may include one or more optional embedded heating elements 176, optional embedded thermal isolators 174 and/or optional conduits 168, 170 to control a lateral temperature profile of the substrate support assembly 150. In one embodiment, a thermal gasket 138 is disposed on at least a portion of the base plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The conduits 168, 170 and embedded heating elements 176 may be utilized to control the temperature of the electrostatic chuck 166, and for heating and/or cooling the electrostatic chuck 166 and a substrate (e.g., a wafer) being processed. In one embodiment, the electrostatic chuck 166 includes two separate heating zones that can maintain distinct temperatures. In another embodiment, the electrostatic chuck 166 includes four different heating zones that can maintain distinct temperatures. More or fewer heating zones may also be used. The temperature of the electrostatic chuck 166 and the base plate 164 may be monitored using multiple temperature sensors 190, 192 that may be monitored using a controller 195.

The electrostatic chuck 166 may further include multiple gas passages such as grooves, mesas and other surface features that may be formed in an upper surface of the electrostatic chuck 166. The gas passages may be fluidly coupled to a source of a heat transfer (or backside) gas, such as He via holes drilled in the puck. In operation, the backside gas may be provided at controlled pressure into the gas passages to enhance the heat transfer between the electrostatic chuck 166 and the substrate 144.

In one embodiment, the electrostatic chuck 166 includes at least one clamping electrode 180 controlled by a chucking power source 182. The clamping electrode 180 (also referred to as a chucking electrode) may further be coupled to one or more RF power sources 184, 186 through a matching circuit 188 for maintaining a plasma formed from process and/or other gases within the processing chamber 100. The one or more RF power sources 184, 186 are generally capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
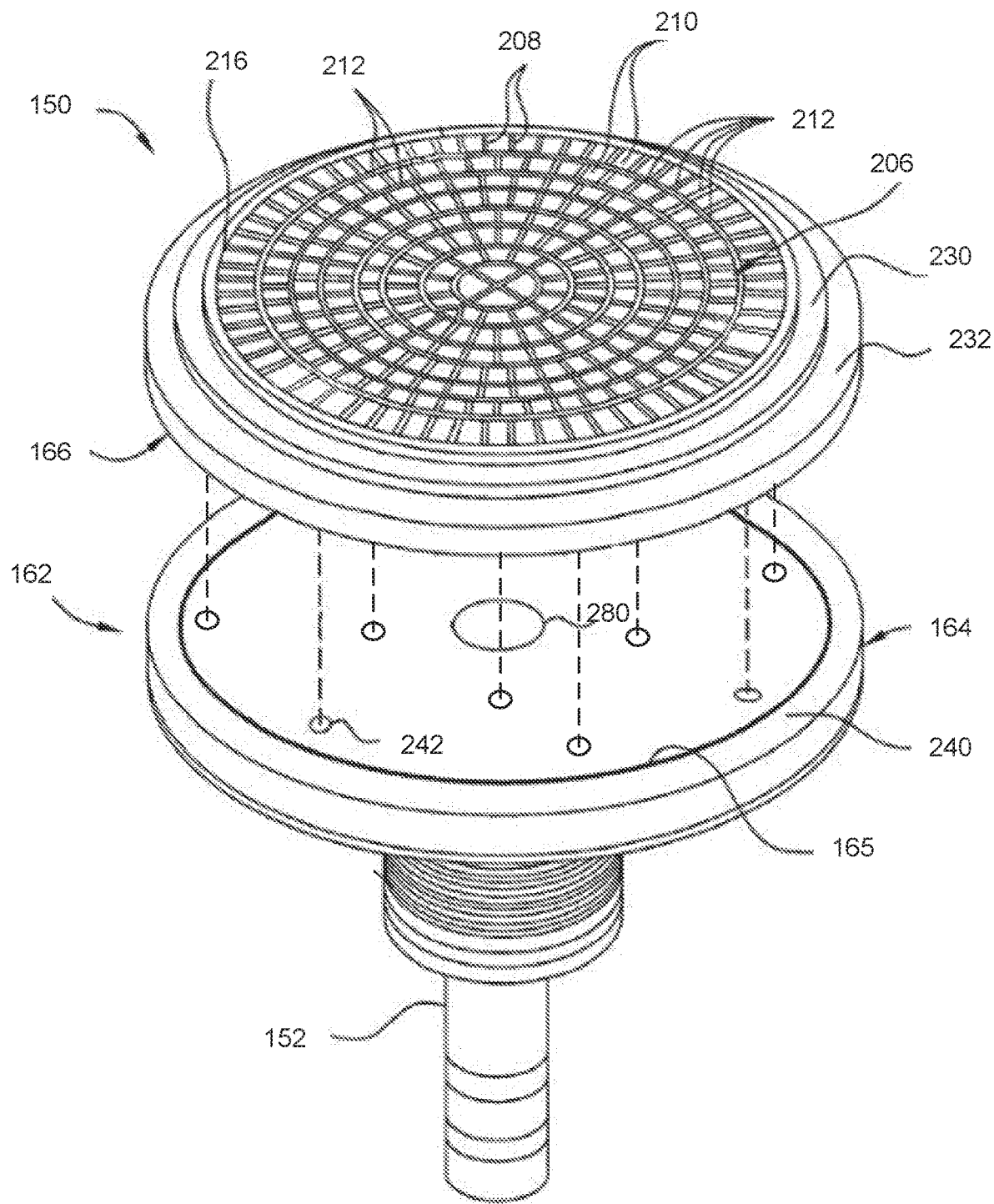
FIG. 2 depicts an exploded view of one embodiment of a substrate support assembly.

FIG. 2 depicts an exploded view of one embodiment of the substrate support assembly 150 including the electrostatic chuck 166, the mounting plate 162, the base plate 164, a cooling plate 165, and the pedestal 152. As shown, in one embodiment a base plate 164 may include an inner recess, and the cooling plate 165 may be inserted into and attached to the inner recess. An o-ring (not shown) may be disposed over the base plate 164 at a periphery 240 of the base plate 164. In one embodiment, the o-ring is a perfluoropolymer (PFP) o-ring. Alternatively, other types of high temperature o-rings may be used. In one embodiment, thermally insulating high temperature o-rings are used. The o-ring may be a stepped o-ring having a first step at a first thickness and a second step at a second thickness. This may facilitate uniform tightening of fasteners by causing the amount of force used to tighten the fasteners to increase dramatically after a set amount of compression of the PFP o-ring.

Additional o-rings (not shown) may also be disposed on the top side of the cooling plate 165 and/or base plate 164 around a hole 280 at a center of the cooling plate 165 through which cables are run. Other smaller o-rings may also be disposed on the cooling plate 165 and/or base plate 164 around other openings, around lift pins, and so forth. The o-rings provide a vacuum seal between a chamber interior volume and interior volumes within the substrate support assembly 150. The interior volumes within the substrate support assembly 150 include open spaces within the pedestal 152 for routing conduits and wiring.

In one embodiment, a gasket (e.g., a PFP gasket) may be disposed on the top side of the cooling plate 165. Examples of PFPs usable for the gasket or o-ring are Dupont'S™ ECCtreme™, Dupont's KALREZ® and Daikin's® DUPRA™. Alternatively, the gasket may be a stack of alternating layers of Grafoil® and polyimide.

The cooling plate 165 and/or base plate 164 additionally include numerous features 242 through which fasteners are inserted. The gasket may have cutouts at each of the features 242 in some embodiments.

Fasteners extend through each of the features 242 and attach to additional portions of the fasteners (or to additional fasteners) that are inserted into additional features formed in adapter objects bonded to the electrostatic chuck 166. For example, a bolt may extend through a feature 242 in the cooling plate 165 and be screwed into a nut disposed in a feature of the electrostatic chuck 166. Alternatively, fasteners may extend through features 242 and attach to features formed in the adapter objects bonded to the bottom of the electrostatic chuck 166. Each feature 242 in the cooling plate 165 may line up to a similar feature (not shown) in electrostatic chuck 166.

The electrostatic chuck 166 has a disc-like shape having an annular periphery 230 that may substantially match the shape and size of the substrate 144 positioned thereon. An upper surface of the electrostatic chuck 166 may have an outer ring 216, multiple mesas 206, 210 and channels 208, 212 between the mesas 210. The electrostatic chuck 166 includes a lip 232 that rests on the outer periphery 240 of the base plate 164. In one embodiment, the electrostatic chuck 166 may be fabricated by an electrically insulative ceramic material. Suitable examples of the ceramic materials include aluminum nitride (AlN), alumina ($Al_2O_3$), and the like.

The electrostatic chuck 166 may include two or more adapter objects (not shown) bonded to a bottom of the electrostatic chuck 166. Each adapter object may include one or more features (not shown) for receiving fasteners. The features may be approximately evenly distributed across a surface of the electrostatic chuck 166, and may include a first set of features at a first distance from a center of a circle defined by the bottom of the electrostatic chuck 166 and a second set of features at a second distance from the center of the circle defined by the bottom of the electrostatic chuck 166.

The base plate 164 attached below the electrostatic chuck 166 may have a disc shape and be positioned on the mounting plate 162. In one embodiment, the base plate 164 may be fabricated by a metal, such as aluminum or stainless steel or other suitable materials. In one embodiment, the cooling plate 165 may be fabricated from a metal such as aluminum, stainless steel, or other materials. Alternatively, the cooling plate 165 may be fabricated by a composite ceramic, such as an aluminum-silicon alloy infiltrated SiC or Molybdenum to match a thermal expansion coefficient of the electrostatic chuck 166.

Figure 3:
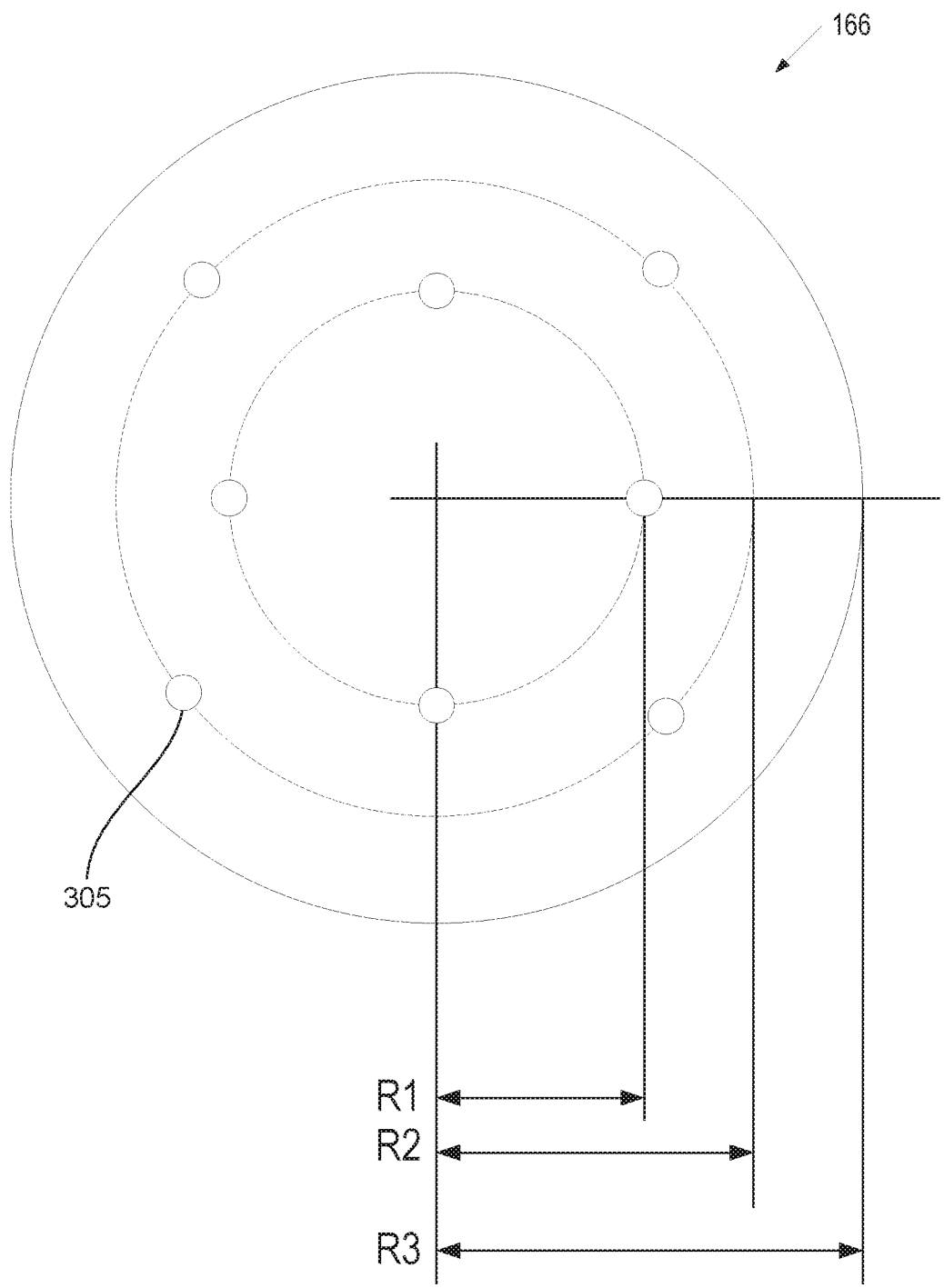
FIG. 3 depicts a sectional top view of one embodiment of a substrate support assembly.

FIG. 3 depicts a sectional top view of one embodiment of an electrostatic chuck 166. As shown, the electrostatic chuck 166 has a radius R3, which may be substantially similar to a radius of substrates or wafers that are to be supported by the electrostatic chuck 166. The electrostatic chuck 166 additionally includes multiple features 305. The features may match similar features in a cooling plate to which the electrostatic chuck 166 is mounted. Each feature 305 accommodates a fastener. For example, a bolt (e.g., a stainless steel bolt, galvanized steel bolt, etc.) may be placed into each feature such that a head of the bolt is inside of an opening large enough to accommodate the head and a shaft of the bolt extends out of a bottom side of the electrostatic chuck 166. The bolt may be tightened onto a nut that is placed in a corresponding feature in the cooling plate. Alternatively, features 305 may be sized to accommodate a nut, and may include a hole that can receive a shaft of a bolt that is accommodated by a corresponding feature in the cooling plate. In another example, a helical insert (e.g., a Heli-Coil®) or other threaded insert (e.g., a press fit insert, a mold-in insert, a captive nut, etc.) may be inserted into one or more of the features to add a threaded hole thereto. In one embodiment, the features 305 are threaded holes into which a bolt or threaded rod may be inserted. A bolt placed inside of the base plate and protruding from the cooling plate may then be threaded into the threaded insert or threaded feature to secure the base plate and cooling plate to the electrostatic chuck 166. Alternatively, or additionally, threaded inserts may be used in the cooling plate and/or base plate.

The features 305 may be slightly oversized as compared to a size of the fasteners in some embodiments to accommodate a greater coefficient of thermal expansion of the fasteners. In one embodiment, the fasteners are sized such that the fasteners will not exert a force on the features when the fasteners are heated to 500 or 600 degrees Celsius.

As shown, multiple sets of features 305 may be included in the electrostatic chuck 166. Each set of features 305 may be evenly spaced at a particular radius or distance from a center of a circle defines by the electrostatic chuck 166. For example, as shown a first set of features 305 is located at a radius R1 and a second set of features 305 is located at a radius R2. Additional sets of features may also be located at additional radii.

In one embodiment, the features 305 are arranged to create a uniform load on the electrostatic chuck 166. In one embodiment, the features are arranged such that a bolt is located approximately every 30-70 square centimeters (e.g., every 50 square centimeters). In one embodiment, three sets of features are used for a 12 inch electrostatic chuck 166. A first set of features may be located about 4 inches from a center of the electrostatic chuck 166 and includes about 4 features. A second set of features may be located about 6 inches from a center of the electrostatic chuck 166 and includes about 6 features. A third set of features may be located about 8 inches from a center of the electrostatic chuck 166 and includes about 8 features. In one embodiment, the electrostatic chuck 166 includes about 8-24 features arranged in sets at 2-3 different radii, where each feature accommodates a fastener.

Figure 4A:
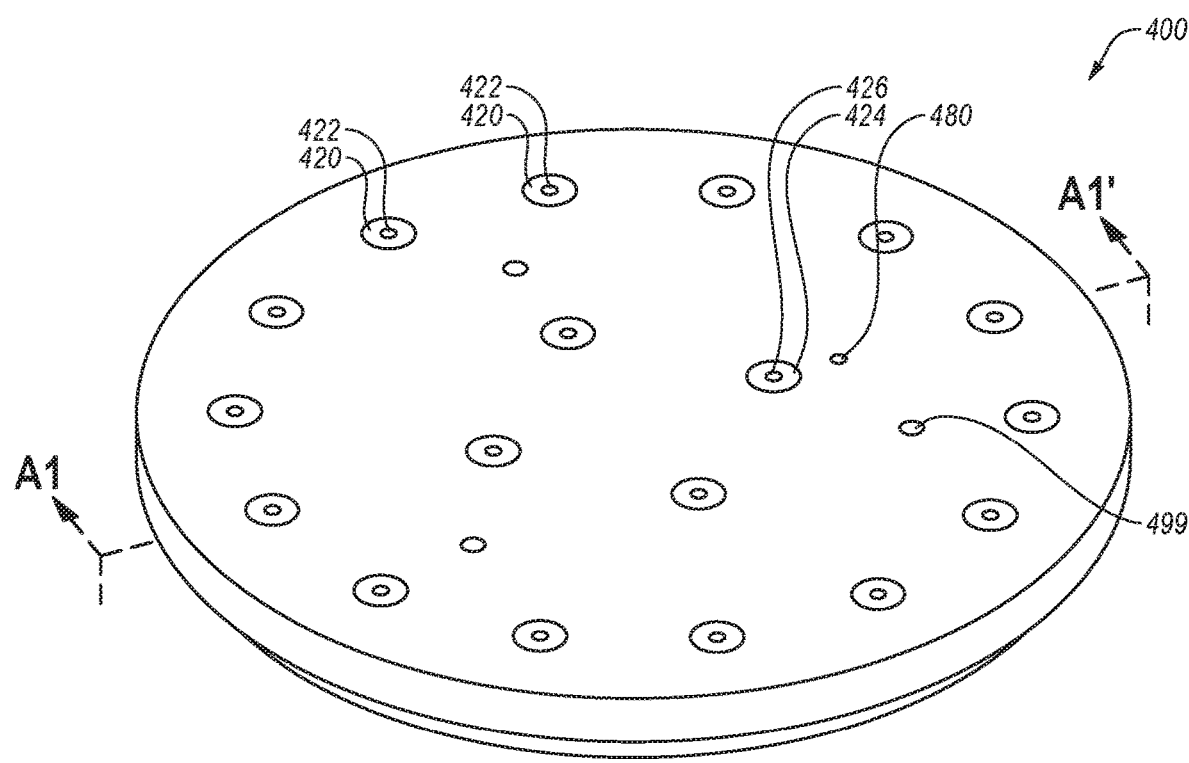
FIG. 4A depicts a perspective view of one embodiment of an electrostatic chuck.

FIG. 4A depicts a perspective view of one embodiment of a bottom of an electrostatic chuck 400. The electrostatic chuck 400 is shown upside down to better show particular components of the electrostatic chuck 400. As illustrated, the bottom of the electrostatic chuck 400 defines a circle. Multiple holes have been drilled into the bottom of the electrostatic chuck, and adapter objects 420, 424 have been inserted into those holes and bonded to the electrostatic chuck 400 using a metal bond. Each of the adapter objects 420, 424 includes one or more features 422, 426. For example, adapter objects 420 near a periphery of the electrostatic chuck 400 include features 422 and adapter objects 424 near a center of the circle defined by the bottom of the electrostatic chuck 400 include features 426. As illustrated, each adapter object 420, 424 has a circular shape and includes a single feature 422, 426. However, in alternative embodiments adapter objects 420, 424 may have different shapes, have different sizes and/or contain more than one feature. For example, adapter objects 420, 424 may be square, rectangular, hexagonal, octagonal, or have other shapes.

Electrostatic chuck 400 may additionally include one or more lift pin holes 499 and/or a gas delivery hole 480. In the illustrated example, a line A1-A1' is shown that passes through two outer adapter objects 420, two inner adapter objects 424 and the gas delivery hole 480.

Figure 4B:
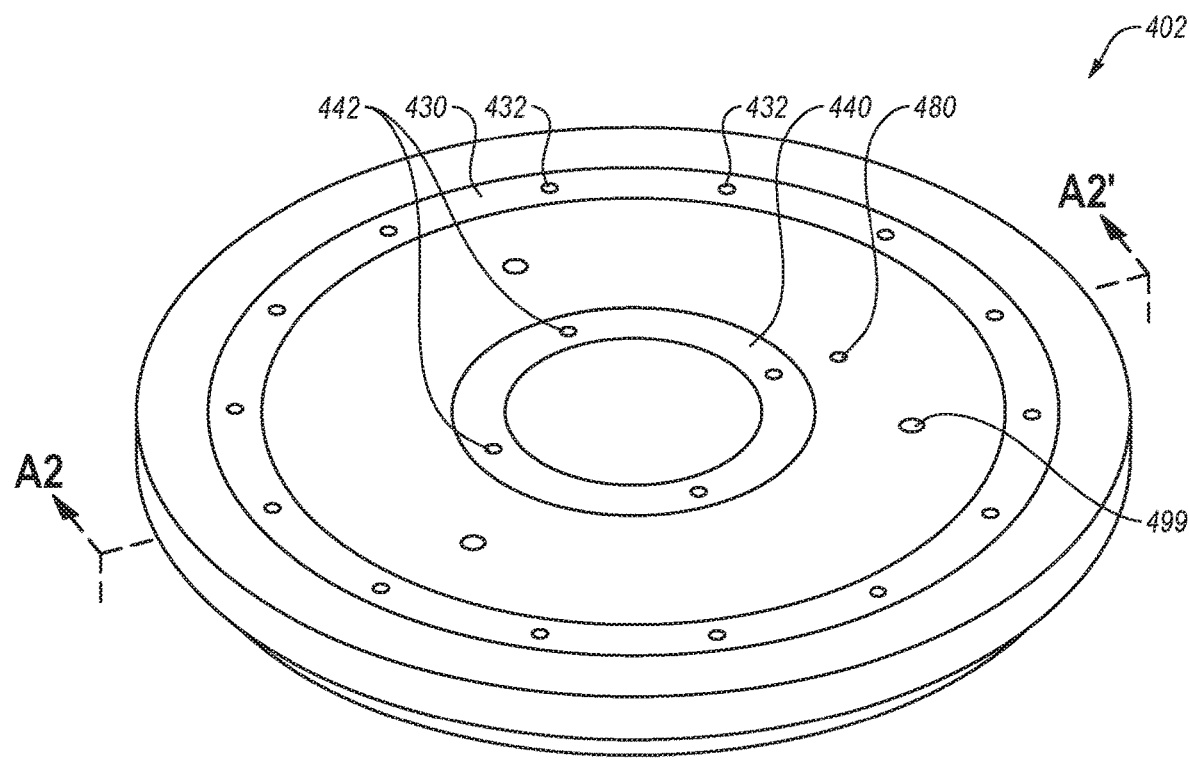
FIG. 4B depicts a perspective view of another embodiment of an electrostatic chuck.

FIG. 4B depicts a perspective view of one embodiment of a bottom of an electrostatic chuck 402. The electrostatic chuck 402 is shown upside down to better show particular components of the electrostatic chuck 402. As illustrated, the bottom of the electrostatic chuck 402 defines a circle. Two ring shaped trenches have been machined into the bottom of the electrostatic chuck 402, and adapter objects 430, 440 have been inserted into those ring shaped trenches and bonded to the electrostatic chuck 402 using a metal bond. Each of the adapter objects 430, 440 includes multiple features 432, 442. For example, adapter object 430 near a periphery of the electrostatic chuck 402 include features 432 and adapter object 440 near a center of the circle defined by the bottom of the electrostatic chuck 402 include features 442. As illustrated, adapter object 430 and 440 each have a ring shape and includes multiple features 432, 442. However, in alternative embodiments adapter objects 430, 440 may have different shapes, have different sizes and/or contain different amounts of features. For example, an electrostatic chuck may include one or more straight rectangular adapter objects, some of which may include features near the center of the electrostatic chuck as well as features near the periphery of the electrostatic chuck. An electrostatic chuck may additionally or alternatively include adapter objects having a shape of a partial ring that include multiple outer features or multiple inner features.

Electrostatic chuck 402 may additionally include one or more lift pin holes 499 and/or a gas delivery hole 480. In the illustrated example, a line A2-A2' is shown that passes through adapter object 430, adapter object 440 and the gas delivery hole 480.

Figure 5:
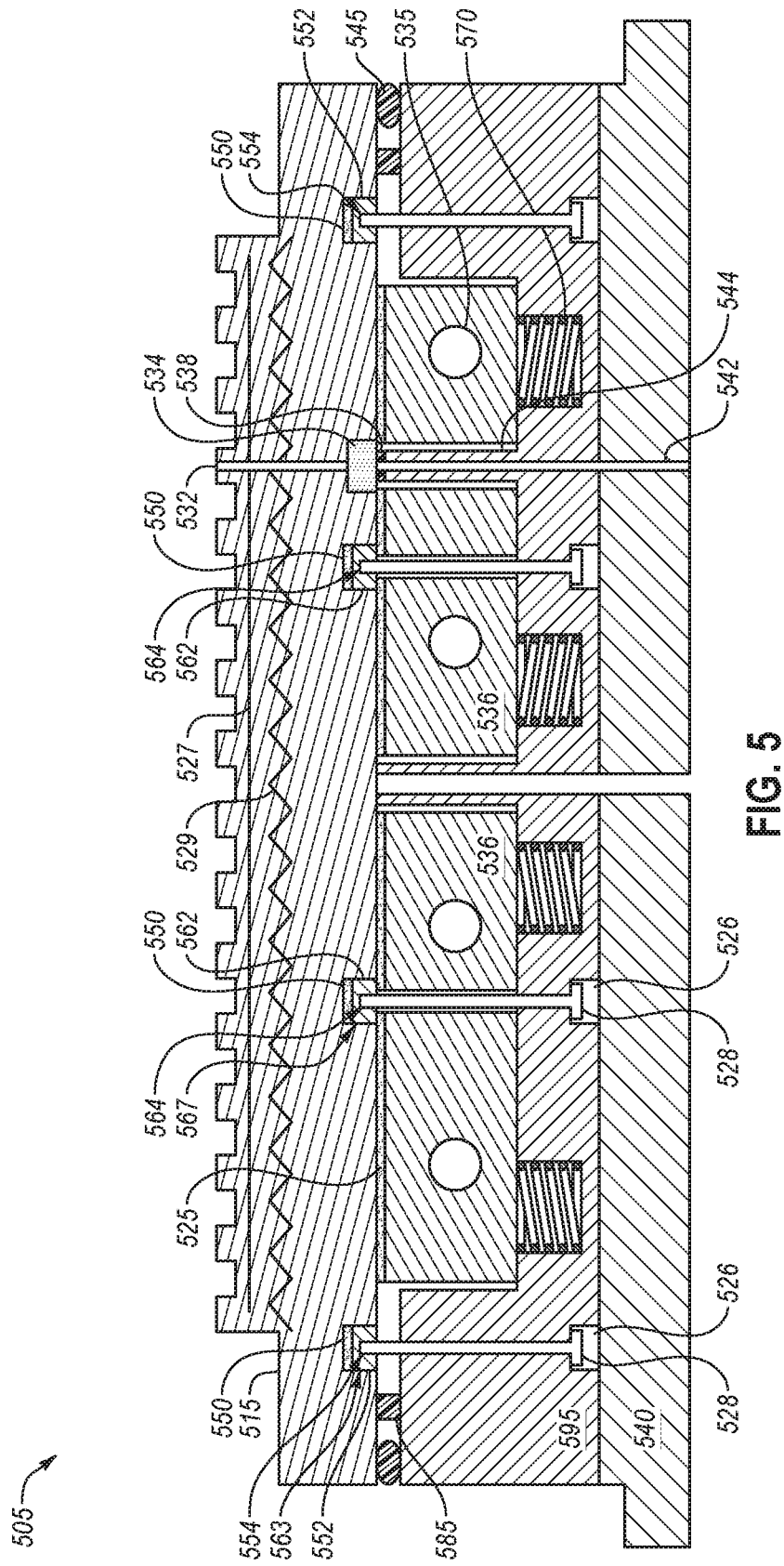
FIG. 5 depicts a sectional side view of one embodiment of a substrate support assembly.

FIG. 5 depicts a sectional side view of one embodiment of a substrate support assembly 505. In one embodiment, substrate support assembly 505 corresponds to substrate support assembly 150 of FIGS. 1-2. The substrate support assembly 505 includes an electrostatic chuck 515, a base plate 595, a cooling plate 536 and a mounting plate 540.

In one embodiment, electrostatic chuck 515 corresponds to electrostatic chuck 400 of FIG. 4A. The sectional side view of FIG. 5 is shown at a cut line that corresponds to line A1-A1' of FIG. 4A in one embodiment. In one embodiment electrostatic chuck 515 corresponds to electrostatic chuck 402 of FIG. 4B. The sectional side view of FIG. 5 is shown at a cut line that corresponds to line A2-A2' of FIG. 4B in one embodiment.

The electrostatic chuck 515 is composed of an electrically insulative (dielectric) ceramic such as AlN or $Al_2O_3$. The electrostatic chuck 515 includes clamping electrodes 527 and one or more heating elements 529. The clamping electrodes 527 may be coupled to a chucking power source (not shown), to an RF plasma power supply (not shown) and/or to an RF bias power supply (not shown) via a matching circuit (not shown). The heating elements 529 are electrically connected to a heater power source (not shown) for heating the electrostatic chuck 515.

In one embodiment, the electrostatic chuck 515 includes multiple recesses 563, 567. The recesses 563, 567 may be holes and/or trenches of varying shape, depth and size. In the embodiments where electrostatic chuck 515 corresponds to electrostatic chuck 400 of FIG. 4A, the recesses 563 and 567 are circular holes, and there are multiple distinct recesses 563 and multiple distinct recesses 567. In the embodiments where electrostatic chuck 515 corresponds to electrostatic chuck 402 of FIG. 4B, the recesses 563 are a ring shaped trench and the recesses 567 are another ring shaped trench.

Recess 563 includes an adapter object 552 that is bonded to the recess 563 by a metal bond 550. The adapter object 552 may be bonded to the bottom of the electrostatic chuck in the recess 563. Similarly, recess 567 includes an adapter object 562 that is bonded to the recess 567 by a metal bond 550. The adapter object 562 may be bonded to the bottom of the electrostatic chuck in the recess 567. Adapter object 552 includes one or more features 554. Adapter object 562 additionally includes one or more features 564. Each feature is configured to receive a fastener, as is described in greater detail below.

Preferably, the adapter objects 552, 562 are made of a material having a CTE that matches or is similar to a CTE of the electrostatic chuck 515. In one embodiment, the adapter objects 552, 562 are molybdenum. In another embodiment, the adapter objects are made of a nickel-cobalt ferrous alloy such as Kovar®.

In another embodiment, the adapter objects 552, 562 are made of an electrically conductive metal matrix composite (MMC) material. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), or various combinations thereof. The reinforcing material may be selected to provide the desired structural strength for the MMC, and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The MMC material is preferably chosen to substantially match the CTE of the electrostatic chuck 515 over the operating temperature range for the substrate support assembly 505. In one embodiment, the temperature may range from about 20° Celsius to about 500° Celsius. In one embodiment, matching the CTEs is based on selecting the MCC material so that the MCC material includes at least one material which is also used in the electrostatic chuck 515. In one embodiment, the electrostatic chuck 515 includes AlN. In one embodiment, the MMC material includes a SiC porous body that is infiltrated with an AlSi alloy (referred to herein as AlSiSiC).

The constituent materials and composition percentages of the MMC may be selected to provide an engineered material which meets desirable design objectives. For example, by suitably selecting the MCC material to closely match the CTE of the electrostatic chuck 515, the thermo-mechanical stresses at an interface between the adapter objects 552, 562 and the electrostatic chuck 515 are reduced.

By matching coefficients of thermal expansion between the adapter objects 552, 562 and the electrostatic chuck 515, stress caused by bonding the adapter objects 552, 562 to the electrostatic chuck 515 may be minimized. In one embodiment, diffusion bonding is used as the method of metal bonding to produce the metal bond 550. In another embodiment, brazing is used to produce the metal bond 550. However, other bonding methods may also be used to produce the metal bond.

Metal bond 550 may include an "interlayer" of aluminum foil or other metal foil that is placed in a bonding region between the electrostatic chuck 515 and the adapter object 552, 562. Pressure and heat may be applied to form a diffusion bond between the aluminum foil and the electrostatic chuck 515 and between the aluminum foil and adapter object 552, 562. In other embodiments, the diffusion bonds may be formed using other interlayer materials which are selected based upon the materials used for electrostatic chuck 515 and the adapter object 552, 562. In one embodiment, the metal bond 550 has a thickness of about 0.2-0.3 mm. In one embodiment, the electrostatic chuck 515 may be directly bonded to the adapter object 552, 562 using direct diffusion bonding in which no interlayer is used to form the bond.

The electrostatic chuck 515 may have a thickness of about 5-35 mm. In one embodiment, the electrostatic chuck 515 has a thickness of about 8-15 mm. The clamping electrodes 527 may be located about 0.3 to 1 mm from an upper surface of the electrostatic chuck 515, and the heating elements 529 may be located about 2 mm under the clamping electrodes 527. The heating elements 529 may be screen printed heating elements having a thickness of about 10-200 microns. Alternatively, the heating elements 529 may be resistive coils that use about 1-3 mm of thickness of the electrostatic chuck 515. In one embodiment, the electrostatic chuck 515 additionally includes enough additional thickness to accommodate the recesses 563, 567 and inserted adapter objects 552, 562. The adapter objects 552, 562 may have a thickness of about 5 mm to about 25 mm in some embodiments.

In one embodiment, the electrostatic chuck 515 has a diameter of about 300 mm. Alternatively, the electrostatic chuck 515 may have any other diameter. An edge of base plate 595 may have a similar diameter to the diameter of the electrostatic chuck 515. A plasma resistant and high temperature o-ring 545 may be disposed between electrostatic chuck 515 and the base plate 595. This o-ring 545 may provide a vacuum seal between an interior of the substrate support assembly 505 and a processing chamber. The o-ring 545 may be made of a perfluoropolymer (PFP). In one embodiment, the o-ring 545 is a PFP with inorganic additives such as SiC. The o-ring 545 may be replaceable.

The base plate 595 includes a cooling plate 536 that may act as a heat sink for the electrostatic chuck 515. The material of the cooling plate 536 may affect the heat transfer properties of the cooling plate 536. For example, an aluminum cooling plate 536 will transfer heat better than a stainless steel cooling plate 536.

The cooling plate 536 may be coupled to the base plate 595 by one or more springs 570, which operate to press the heat sink 536 against the electrostatic chuck 515. In one embodiment, the springs 570 are coil springs. The springs 570 apply a force to press the heat sink 536 against the electrostatic chuck 515. The electrostatic chuck 515 is coupled to and in thermal communication with the cooling plate 536. The cooling plate 536 has one or more conduits 535 (also referred to herein as cooling channels) in fluid communication with a fluid source (not shown).

The adapter objects 552, 562 may collectively include numerous features 554, 564 for receiving fasteners. The base plate 595 may likewise include multiple features 526 for accommodating the fasteners. Additionally, the cooling plate 536 may include multiple bores for accommodating the fasteners. In one embodiment, the cooling plate 536 and/or base plate 595 are coupled to the electrostatic chuck 515 by multiple fasteners 528. The fasteners 528 may be threaded fasteners such as bolts or nut and bolt pairs.

In one embodiment, the features 526 are bolt holes with counter bores. The features may be through features that extend through the base plate 595. In one embodiment, the features 554, 564 are threaded holes in the adapter objects 552, 562. Alternatively, the features may be holes and/or slots that accommodate a t-shaped bolt head or rectangular nut that may be inserted into the slot and then rotated 90 degrees. In one embodiment, a helical insert (e.g., a Heli-Coil®) or other threaded insert (e.g., a press fit insert, a mold-in insert, a captive nut, etc.) may be inserted into features 554 to add a threaded hole thereto. A bolt placed inside of the cooling plate 536 and/or base palate 595 (e.g., inside features 526 in the base plate 595 through the cooling plate 536) and protruding from the cooling plate 536 may then be threaded into the threaded insert or the threaded hole to secure the cooling plate to the puck. In one embodiment, the fasteners include washers, Grafoil®, aluminum foil, or other load spreading materials to distribute forces from a head of the fastener evenly over a feature.

In one embodiment, the features 554, 564 are threaded holes that are brazed prior to insertion of a threaded rod into the features 554, 564. A metal bonding (e.g., diffusion bonding) procedure may then be performed to secure the threaded rod to the feature 554, 564. This may provide increased durability for application of increased force during assembly.

The cooling plate 536 may act as a heat sink to absorb heat from the electrostatic chuck 515. In one embodiment (as shown), a low thermal conductivity gasket 525 is disposed on the cooling plate 436. The low thermal conductivity gasket 525 may be, for example, a PFP gasket that is disposed on the cooling plate 536. The PFP gasket may have a thermal conductivity of about 0.2 Watts per meter Kelvin (W/(mK)) or lower.

Alternatively, the low thermal conductivity gasket 525 may be an alternating stack of Grafoil® and polyimide layers. For example, the low thermal conductivity gasket 525 may be a stack of a first Grafoil® layer, a polyimide layer on the first Grafoil® layer, and a second Grafoil® layer on the polyimide layer. In another example, the low thermal conductivity gasket 525 may be a stack of a first Grafoil® layer, a first polyimide layer on the first Grafoil® layer, a second Grafoil® layer on the first polyimide layer, a second polyimide layer on the second Grafoil® layer, and a third Grafoil® layer on the second polyimide layer.

The polyimide layers may have a very low thermal conductivity of about 0.2 Watts per meter Kelvin (W/(m·K)). However, the polyimide may have a low compressibility. The low compressibility may reduce a contact area between the electrostatic chuck 515 and the cooling plate 536 if the polyimide is used by itself to form the low thermal conductivity gasket 525. The Grafoil® layers have a high thermal conductivity, but also have a high compressibility. Grafoil® may have an in plane thermal conductivity of 240 W/(m·K) and a through plane thermal conductivity of 5 W/(m·K). Accordingly, by using an alternating stack of Grafoil® and polyimide the low thermal conductivity gasket 525 may have both a medium to high compressibility and a low thermal conductivity. The compressibility of polyimide is about 1-2% and the compressibility of Grafoil® is about 5-10% in embodiments.

The fasteners 528 may be tightened with approximately the same force to evenly compress the high temperature o-ring 545 and/or other o-rings. The low thermal conductivity gasket 525 may decrease heat transfer between the electrostatic chuck 515 and the cooling plate 536 and act as a thermal choke. In one embodiment, a Grafoil® layer (not shown) is disposed over the low thermal conductivity gasket 525. The Grafoil® may have a thickness of about 10-40 mil. The fasteners may be tightened to compress the Grafoil® layer as well as the low thermal conductivity gasket 525.

By maintaining a thermal choke between the electrostatic chuck 515 and the cooling plate 536, the electrostatic chuck 515 may be maintained at much greater temperatures than the cooling plate 536. For example, in some embodiments the electrostatic chuck 515 may be heated to temperatures of 200-300 degrees Celsius, while the cooling plate 536 may maintain a temperature of below about 80 degrees Celsius. In one embodiment, the electrostatic chuck 515 may be heated up to a temperature of about 250° C. while maintaining the cooling plate 536 at a temperature of about 60° C. or below. Accordingly, up to a 250° C. delta may be maintained between the electrostatic chuck 515 and the cooling plate 536 in embodiments. The electrostatic chuck 515 and the cooling plate 536 are free to expand or contract independently during thermal cycling.

In one embodiment, a mounting plate 540 is disposed beneath and coupled to the base plate 595. In one embodiment, a thermal spacer 585 is disposed on the base plate 595 (e.g., adjacent to the o-ring 545). The thermal spacer 585 may be used to ensure that the base plate 595 will not come into contact with the electrostatic chuck 515.

In one embodiment, one or more gas holes 532, 542 are drilled into the cooling plate 536, the base plate 595 and/or the electrostatic chuck 515. The gas holes 532, 542 may be used to deliver a backside gas such as helium to a backside of a chucked substrate. In one embodiment, the electrostatic chuck 515 includes a gas hole 532 that terminates at a porous plug 534. The gas hole 532 may be a through hole that is counter bored with a larger diameter bore to permit the porous plug 534 to be inserted into the larger diameter bore. The porous plug 534 may be a porous ceramic such as AlN or $Al_2O_3$. The porous plug 534 may prevent arcing and/or may prevent a plasma from being generated within the electrostatic puck 505. The porous plug may have a porosity of anywhere between about 30% to about 60%.

In one embodiment, the cooling plate 536 includes a hole, and the base plate 595 includes a projection 544 that extends through the hole in the cooling plate 536. The hole 542 may be bored into the projection 544 (e.g., into a center of the projection 544). In one embodiment, an o-ring 538 is disposed on a top of the projection 544. The fasteners 526 may compress the o-ring 538 when tightened. The o-ring 538 may be a same type of o-ring as o-ring 545 in embodiments.

Figure 6A:
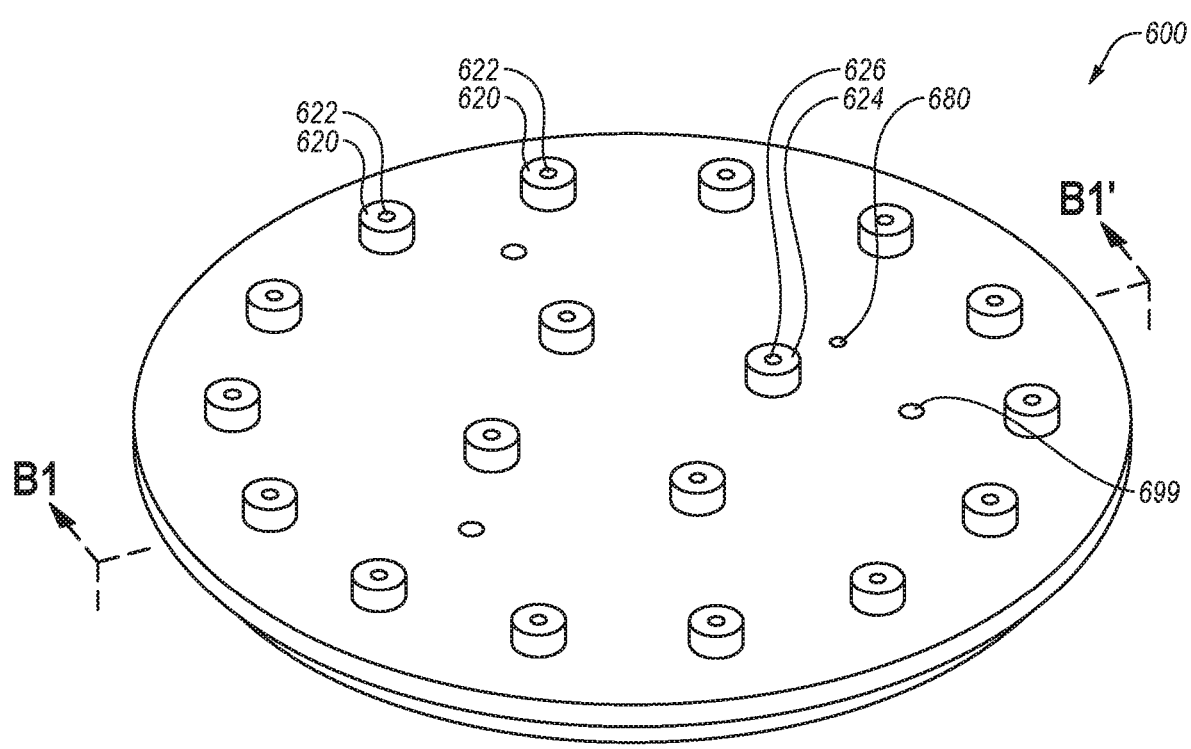
FIG. 6A depicts a perspective view of one embodiment of an electrostatic chuck.

FIG. 6A depicts a perspective view of one embodiment of a bottom of an electrostatic chuck 600. The electrostatic chuck 600 is shown upside down to better show particular components of the electrostatic chuck 600. As illustrated, the bottom of the electrostatic chuck 600 is flat or approximately flat and defines a circle. Adapter objects 620, 624 have been bonded to the bottom of the electrostatic chuck 600 using a metal bond. Each of the adapter objects 620, 624 includes one or more features 622, 626. For example, adapter objects 620 near a periphery of the electrostatic chuck 600 include features 622 and adapter objects 624 near a center of the circle defined by the bottom of the electrostatic chuck 600 include features 626. As illustrated, each adapter object 620, 624 has a circular shape and includes a single feature 622, 626. However, in alternative embodiments adapter objects 620, 624 may have different shapes, have different sizes and/or contain more than one feature. For example, adapter objects 620, 624 may be square, rectangular, hexagonal, octagonal, or have other shapes.

Electrostatic chuck 600 may additionally include one or more lift pin holes 699 and/or a gas delivery hole 680. In the illustrated example, a line B1-B1' is shown that passes through two outer adapter objects 620, two inner adapter objects 624 and the gas delivery hole 680. The electrostatic chuck 600 is similar to electrostatic chuck 400 except that for electrostatic chuck 600 the adapter objects 620, 624 are bonded to the bottom surface of the electrostatic chuck rather than to holes bored in the bottom of the electrostatic chuck 400.

Figure 6B:
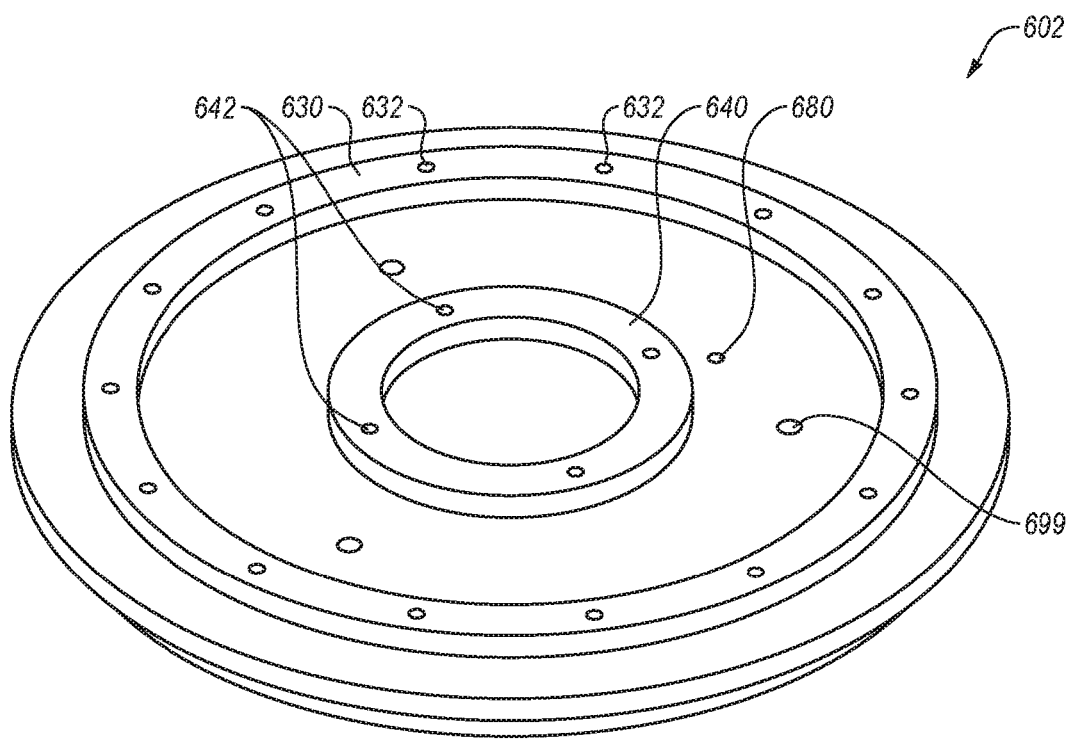
FIG. 6B depicts a perspective view of another embodiment of an electrostatic chuck.

FIG. 6B depicts a perspective view of one embodiment of a bottom of an electrostatic chuck 602. The electrostatic chuck 602 is shown upside down to better show particular components of the electrostatic chuck 602. As illustrated, the bottom of the electrostatic chuck 602 is flat or approximately flat and defines a circle. Two ring shaped adapter objects 630, 640 have been bonded to the bottom of the electrostatic chuck 602 using a metal bond. Each of the adapter objects 630, 640 includes multiple features 632, 642. For example, adapter object 630 near a periphery of the electrostatic chuck 602 include features 632 and adapter object 640 near a center of the circle defined by the bottom of the electrostatic chuck 602 include features 642.

As illustrated, adapter object 630 and 640 each have a ring shape and includes multiple features 632, 642. However, in alternative embodiments adapter objects 630, 640 may have different shapes, have different sizes and/or contain different amounts of features. For example, an electrostatic chuck may include one or more straight rectangular adapter objects, some of which may include features near the center of the electrostatic chuck as well as features near the periphery of the electrostatic chuck. An electrostatic chuck may additionally or alternatively include adapter objects having a shape of a partial ring that include multiple outer features or multiple inner features.

Electrostatic chuck 602 may additionally include one or more lift pin holes 699 and/or a gas delivery hole 680. In the illustrated example, a line B2-B2' is shown that passes through adapter object 630, adapter object 640 and the gas delivery hole 680. The electrostatic chuck 602 is similar to electrostatic chuck 402 except that for electrostatic chuck 602 the adapter objects 630, 640 are bonded to the bottom surface of the electrostatic chuck rather than to trenches machined in the bottom of the electrostatic chuck 402.

Figure 7:
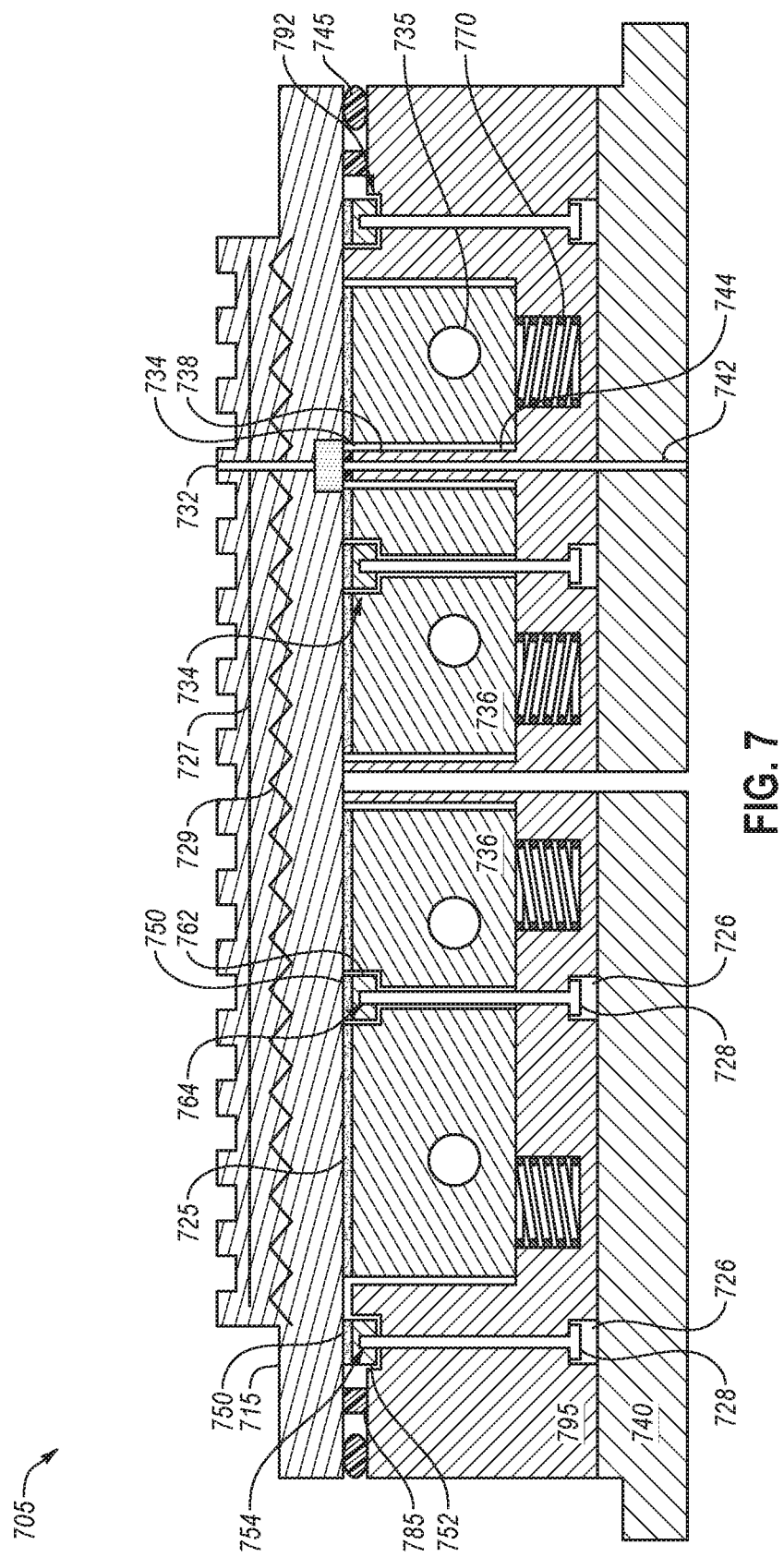
FIG. 7 depicts a sectional side view of one embodiment of a substrate support assembly.

FIG. 7 depicts a sectional side view of one embodiment of a substrate support assembly 705. In one embodiment, substrate support assembly 705 corresponds to substrate support assembly 150 of FIGS. 1-2. The substrate support assembly 705 includes an electrostatic chuck 715, a base plate 795, a cooling plate 736 and a mounting plate 740.

In one embodiment, electrostatic chuck 715 corresponds to electrostatic chuck 600 of FIG. 6A. The sectional side view of FIG. 7 is shown at a cut line that corresponds to line B1-B1' of FIG. 6A in one embodiment. In one embodiment, electrostatic chuck 715 corresponds to electrostatic chuck 602 of FIG. 6B. The sectional side view of FIG. 7 is shown at a cut line that corresponds to line B2-B2' of FIG. 6B in one embodiment.

The electrostatic chuck 715 is composed of an electrically insulative (dielectric) ceramic such as AlN or $Al_2O_3$. The electrostatic chuck 715 includes clamping electrodes 727 and one or more heating elements 729. The clamping electrodes 727 may be coupled to a chucking power source (not shown), to an RF plasma power supply (not shown) and/or to an RF bias power supply (not shown) via a matching circuit (not shown). The heating elements 729 are electrically connected to a heater power source (not shown) for heating the electrostatic chuck 715.

An adapter object 752 is bonded to a bottom of electrostatic chuck 715 by a metal bond 750. An adapter object 762 is also bonded to the bottom of the electrostatic chuck 715 by a metal bond 750. Adapter object 752 includes one or more features 754. Adapter object 762 additionally includes one or more features 764. Each feature is configured to receive a fastener. Metal bonds 750 may be the same as metal bonds 550 that were previously described. The metal bond may be, for example, a metal bond formed by diffusion bonding or brazing. The adapter objects 752, 762 may have a thickness of about 5 mm to about 25 mm.

Preferably, the adapter objects 752, 762 are made of a material having a CTE that matches or is similar to a CTE of the electrostatic chuck 715. In one embodiment, the adapter objects 752, 762 are molybdenum. In another embodiment, the adapter objects are made of a nickel-cobalt ferrous alloy such as Kovar®. In another embodiment, the adapter objects 752, 762 are made of an electrically conductive metal matrix composite (MMC) material such as AlSiSiC.

The electrostatic chuck 715 may have a thickness of about 3-10 mm. In one embodiment, the electrostatic chuck 715 has a thickness of about 3-5 mm. The clamping electrodes 727 may be located about 0.3 to 1 mm from an upper surface of the electrostatic chuck 715, and the heating elements 729 may be located about 2 mm under the clamping electrodes 727. The heating elements 729 may be screen printed heating elements having a thickness of about 10-200 microns. Alternatively, the heating elements 729 may be resistive coils that use about 1-3 mm of thickness of the electrostatic chuck 715. In such an embodiment, the electrostatic chuck 715 may have a minimum thickness of about 5 mm.

In one embodiment, the electrostatic chuck 715 has a diameter of about 300 mm. Alternatively, the electrostatic chuck 715 may have any other diameter. An edge of base plate 795 may have a similar diameter to the diameter of the electrostatic chuck 715. A plasma resistant and high temperature o-ring 745 may be disposed between electrostatic chuck 715 and the base plate 795. This o-ring 745 may provide a vacuum seal between an interior of the substrate support assembly 705 and a processing chamber. The o-ring 745 may be made of a perfluoropolymer (PFP). In one embodiment, the o-ring 745 is a PFP with inorganic additives such as SiC. The o-ring 745 may be replaceable.

The base plate 795 includes a cooling plate 736 that may act as a heat sink for the electrostatic chuck 715. The material of the cooling plate 736 may affect the heat transfer properties of the cooling plate 736. For example, an aluminum cooling plate 736 will transfer heat better than a stainless steel cooling plate 736.

The cooling plate 736 may be coupled to the base plate 795 by one or more springs 770, which operate to press the heat sink 736 against the electrostatic chuck 715. In one embodiment, the springs 770 are coil springs. The springs 770 apply a force to press the heat sink 736 against the electrostatic chuck 715. The electrostatic chuck 715 is coupled to and in thermal communication with the cooling plate 736. The cooling plate 736 has one or more conduits 735 (also referred to herein as cooling channels) in fluid communication with a fluid source (not shown).

The cooling plate 736 and/or base plate 795 may be machined to have a surface profile that is an inverse of (e.g., a negative of) the surface profile of the bottom of the electrostatic chuck 715 with the bonded adapter objects 752, 762. Accordingly, Where the adapter objects 752. 762 protrude from the bottom of the electrostatic chuck 715 the cooling plate 736 and base plate 795 include recesses to accommodate the protruding adapter objects 752, 762. In one embodiment, the recesses have a depth of about 5 mm to about 25 mm, depending on the thickness of the adapter objects 752, 762.

The adapter objects 752, 762 may collectively include numerous features 754, 764 for receiving fasteners. The base plate 795 may likewise include multiple features 726 for accommodating the fasteners. Additionally, the cooling plate 736 may include multiple bores for accommodating the fasteners. In one embodiment, the cooling plate 636 and/or base plate 695 are coupled to the electrostatic chuck 715 by multiple fasteners 728. The fasteners may be threaded fasteners such as bolts or nut and bolt pairs.

In one embodiment, the features 726 are bolt holes with counter bores. The features may be through features that extend through the base plate 795. In one embodiment, the features 754, 764 are threaded holes in the adapter objects 752, 762. Alternatively, the features may be holes and/or slots that accommodate a t-shaped bolt head or rectangular nut that may be inserted into the slot and then rotated 90 degrees. In one embodiment, the fasteners include washers, Grafoil®, aluminum foil, or other load spreading materials to distribute forces from a head of the fastener evenly over a feature. In one embodiment, a helical insert (e.g., a Heli-Coil®) or other threaded insert (e.g., a press fit insert, a mold-in insert, a captive nut, etc.) may be inserted into features 754 to add a threaded hole thereto. A bolt placed inside of the cooling plate 736 and/or base plate 795 (e.g., inside features 726 in the base plate 795, through the cooling plate 736) and protruding from the cooling plate 736 may be threaded into the threaded insert or threaded feature to secure the cooling plate to the electrostatic chuck. Alternatively, threaded inserts may be used in the cooling plate.

In one embodiment, a captive nut, mold insert, press fit insert, or other threaded insert is positioned inside of features 754, 764 in the adapter objects 752, 762. In one embodiment, the features 754, 764 are threaded holes that are brazed prior to insertion of a threaded rod into the features 754, 764. A metal bonding (e.g., diffusion bonding) procedure may then be performed to secure the threaded rod to the feature 754, 764. This may provide increased durability for application of increased force during assembly.

The cooling plate 736 may act as a heat sink to absorb heat from the electrostatic chuck 715. In one embodiment (as shown), a low thermal conductivity gasket 725 is disposed on the cooling plate 736. The low thermal conductivity gasket 725 may be, for example, a PFP gasket or a stack of alternating layers of polyimide and Grafoil®.

The fasteners 728 may be tightened with approximately the same force to evenly compress the low thermal conductivity gasket 725. The low thermal conductivity gasket 725 may decrease heat transfer between the electrostatic chuck 715 and the cooling plate 736 and act as a thermal choke. In one embodiment, a Grafoil® layer (not shown) is disposed over the low thermal conductivity gasket 725. The Grafoil® may have a thickness of about 10-40 mil. The fasteners may be tightened to compress the Grafoil® layer as well as the low thermal conductivity gasket 725. The Grafoil® may be thermally conductive.

By maintaining a thermal choke between the electrostatic chuck 715 and the cooling plate 736, the electrostatic chuck 715 may be maintained at much greater temperatures than the cooling plate 736. For example, in some embodiments the electrostatic chuck 715 may be heated to temperatures of 200-300 degrees Celsius, while the cooling plate 736 may maintain a temperature of below about 120 degrees Celsius. In one embodiment, the electrostatic chuck 715 may be heated up to a temperature of about 250° C. while maintaining the cooling plate 736 at a temperature of about 60° C. or below. Accordingly, up to a 190° C. delta may be maintained between the electrostatic chuck 715 and the cooling plate 736 in embodiments. The electrostatic chuck 715 and the cooling plate 736 are free to expand or contract independently during thermal cycling.

In one embodiment, a mounting plate 740 is disposed beneath and coupled to the base plate 795. In one embodiment, a thermal spacer 785 is disposed on the base plate 795 (e.g., adjacent to the o-ring 745). The thermal spacer 785 may be used to ensure that the base plate 795 will not come into contact with the electrostatic chuck 715.

In one embodiment, one or more gas holes 732, 742 are drilled into the cooling plate 736, the base plate 795 and/or the electrostatic chuck 715. The gas holes 732, 742 may be used to deliver a backside gas such as helium to a backside of a chucked substrate. In one embodiment, the electrostatic chuck 715 includes a gas hole 732 that terminates at a porous plug 734. The gas hole 732 may be a through hole that is counter bored with a larger diameter bore to permit the porous plug 734 to be inserted into the larger diameter bore. The porous plug 734 may be a porous ceramic such as AlN or $Al_2O_3$. The porous plug 734 may prevent arcing and/or may prevent a plasma from being generated within the electrostatic puck 705. The porous plug may have a porosity of anywhere between about 30% to about 60%.

In one embodiment, the cooling plate 736 includes a hole, and the base plate 795 includes a projection 744 that extends through the hole in the cooling plate 736. The hole 742 may be bored into the projection 744 (e.g., into a center of the projection 744). In one embodiment, an o-ring 738 is disposed on a top of the projection 744. The fasteners 728 may compress the o-ring 738 when tightened. The o-ring 738 may be a same type of o-ring as o-ring 745 in embodiments.

Figure 8:
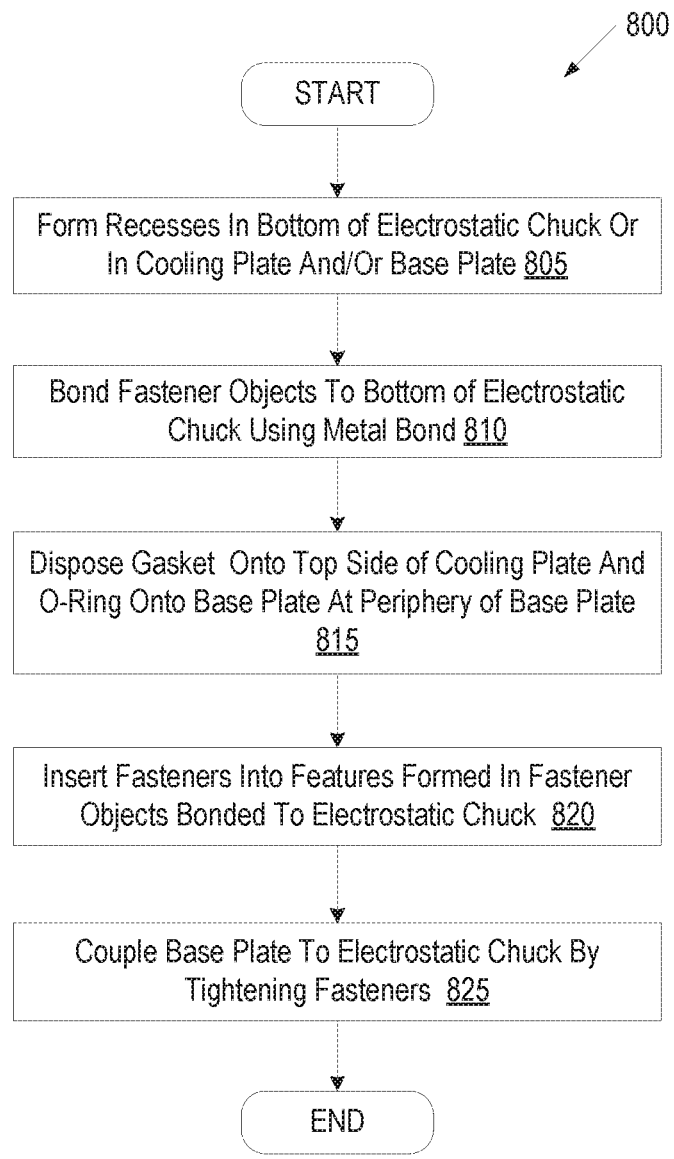
FIG. 8 illustrates one embodiment of a process for manufacturing a substrate support assembly.

FIG. 8 illustrates one embodiment of a process 800 for manufacturing a substrate support assembly. At block 805 of process 800, recesses are formed in either a bottom of an electrostatic chuck or in a top of a cooling plate and/or a top of a base plate. At block 810, two or more adapter objects are bonded to the bottom of the electrostatic chuck. If recesses were formed in the bottom of the electrostatic chuck, then the adapter objects are bonded into the recesses. If recesses were formed in the cooling plate and/or base plate, then the adapter objects are bonded to the bottom of the electrostatic chuck at locations that will align with the recesses. The adapter objects may be formed of AlSiSiC plate, Molybdenum, or another suitable material. Each of the adapter objects includes one or more features for accommodating fasteners.

At block 815, a gasket is disposed on a top side of a cooling plate. The cooling plate may be, for example, an aluminum or aluminum alloy cooling plate with multiple channels to flow a cooling fluid. The gasket may be PFP or an alternating stack of polyimide and Grafoil®. The cooling plate and/or base plate may also have features formed therein. The features in the cooling plate and/or base plate and the features in the lower puck plate may each accommodate a fastener (e.g., a bolt and/or nut).

At block 820, fasteners are inserted into the features in the adapter objects and/or the base plate. At block 825, the electrostatic chuck is coupled to the base plate by tightening the fasteners (e.g., by threading bolts protruding from the features in the lower puck plate into nuts residing in the features in the cooling plate.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An electrostatic chuck comprising:
   a ceramic body; and
   a plurality of adapter objects secured to a bottom surface of the ceramic body, wherein:
      the bottom surface of the ceramic body is substantially planar;
      the plurality of adapter objects collectively form a plurality of openings distributed over the bottom surface of the ceramic body at a plurality of different distances from a center of a circle defined by the bottom surface of the ceramic body;
      the plurality of adapter objects are configured to removably fasten to a base plate via the plurality of openings;
      at least one adapter object of the plurality of adapter objects is inserted into at least one recess formed by the base plate; and
      the ceramic body is configured to removably couple to the base plate.

2. The electrostatic chuck of claim 1 further comprising at least one of:
   one or more heating elements disposed in the ceramic body; or
   one or more electrodes disposed in the ceramic body.

3. The electrostatic chuck of claim 1, wherein the plurality of adapter objects are bonded to the bottom surface of the ceramic body by a metal bond, wherein the ceramic body comprises a first coefficient of thermal expansion and the plurality of adapter objects comprise a second coefficient of thermal expansion approximately equal to the first coefficient of thermal expansion.

4. The electrostatic chuck of claim 1, wherein a first opening of the plurality of openings is configured to couple to a fastener to secure the base plate against the bottom surface of the ceramic body.

5. The electrostatic chuck of claim 1, wherein the plurality of different distances comprise a first distance from the center and a second distance from the center, and wherein the plurality of adapter objects comprise:
   an inner ring or an inner disc having a first diameter, the inner ring or the inner disc comprising a first subset of the plurality of openings that have the first distance from the center; and
   an outer ring having a second diameter, the outer ring comprising a second subset of the plurality of openings that have the second distance from the center.

6. The electrostatic chuck of claim 1, wherein the plurality of adapter objects comprise:
a plurality of discs, each of the plurality of discs comprising one of the plurality of openings.

7. The electrostatic chuck of claim 1, wherein the ceramic body is separated from the base plate by a thermal spacer forming an gap between a portion of the ceramic body and a portion of the base plate, wherein the thermal spacer is further configured to prevent contact of the ceramic body with the base plate.

8. The electrostatic chuck of claim 1, wherein the plurality of adapter objects comprise at least one of a) Molybdenum, b) a nickel-cobalt ferrous alloy, c) a SiC porous body infiltrated with an AlSi alloy, or d) a metal matrix composite comprising Si, SiC, and Ti.

9. The electrostatic chuck of claim 1, wherein the ceramic body comprises AlN or $Al_2O_3$, and wherein each of the plurality of adapter objects comprises at least one of a metal, a metal alloy, or a metal matrix composite.

10. A substrate support assembly comprising:
an electrostatic chuck comprising one or more objects secured to a bottom surface of the electrostatic chuck, wherein:
the bottom surface of the electrostatic chuck is substantially planar;
the one or more objects collectively comprise a plurality of features distributed over the bottom surface of the electrostatic chuck at a plurality of different distances from a center of a circle defined by the bottom surface of the electrostatic chuck;
the one or more objects are configured to removably fasten to a base plate via a first feature of the plurality of features;
at least one object of the one or more objects is inserted into at least one recess formed by the base plate; and
the electrostatic chuck is configured to removably couple to the base plate.

11. The substrate support assembly of claim 10, wherein collectively the plurality of features accommodate a plurality of fasteners.

12. The substrate support assembly of claim 11, wherein the plurality of fasteners comprise a plurality of threaded fasteners and the plurality of features comprise a plurality of openings for receiving the plurality of threaded fasteners.

13. The substrate support assembly of claim 11 further comprising:
the base plate coupled to the electrostatic chuck by the plurality of fasteners, wherein the plurality of fasteners each apply an approximately equal fastening force to couple the base plate to the electrostatic chuck.

14. The substrate support assembly of claim 13 further comprising:
a first gas delivery passage in the base plate;
a second gas delivery passage in the electrostatic chuck that lines up with the first gas delivery passage in the base plate; and
an o-ring at a border of the first gas delivery passage and the second gas delivery passage to provide a seal.

15. The substrate support assembly of claim 13 further comprising:
an o-ring disposed between the electrostatic chuck and the base plate at a periphery of the electrostatic chuck, wherein the o-ring is to provide a vacuum seal between the electrostatic chuck and the base plate.

16. The substrate support assembly of claim 13 further comprising:
a cooling plate disposed in a corresponding recess of the base plate, the cooling plate comprising a plurality of channels to receive a coolant.

17. The substrate support assembly of claim 16, wherein the one or more objects form a pattern that projects from the bottom surface of the electrostatic chuck, wherein a top of the cooling plate forms a plurality of recesses that form a negative of the pattern, and wherein the pattern that projects from the bottom surface of the electrostatic chuck fits into the negative of the pattern in the top of the cooling plate.

18. The substrate support assembly of claim 16, wherein one or more springs connect a bottom surface of the cooling plate to the base plate.

19. The substrate support assembly of claim 18, further comprising:
a gasket disposed on a top side of at least a portion of the cooling plate, wherein the gasket is compressed between the cooling plate and the electrostatic chuck and acts as a thermal choke between the cooling plate and the electrostatic chuck, wherein the one or more springs cause the cooling plate to press against the electrostatic chuck.

20. The substrate support assembly of claim 19, wherein the gasket comprises:
a first graphite layer;
a first polyimide layer on the first graphite layer;
a second graphite layer on the first polyimide layer;
a second polyimide layer on the second graphite layer; and
a third graphite layer on the second polyimide layer.

* * * * *